US012579027B2

(12) United States Patent
Nguyen et al.

(10) Patent No.: US 12,579,027 B2
(45) Date of Patent: Mar. 17, 2026

(54) DATA PROTECTION WITH TIME-VARYING IN-SITU DATA REFRESH

(71) Applicant: Micron Technology, Inc., Boise, ID (US)

(72) Inventors: Dung Viet Nguyen, San Jose, CA (US); James Fitzpatrick, Laguna Niguel, CA (US); Huai-Yuan Tseng, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 18/747,234

(22) Filed: Jun. 18, 2024

(65) Prior Publication Data

US 2025/0013529 A1 Jan. 9, 2025

Related U.S. Application Data

(60) Provisional application No. 63/525,113, filed on Jul. 5, 2023.

(51) Int. Cl.
| | |
|---|---|
| *G06F 11/10* | (2006.01) |
| *G11C 11/406* | (2006.01) |
| *G11C 29/42* | (2006.01) |
| *G11C 29/52* | (2006.01) |

(52) U.S. Cl.
CPC ........ *G06F 11/1044* (2013.01); *G06F 11/106* (2013.01); *G11C 11/406* (2013.01); *G11C 29/42* (2013.01); *G11C 29/52* (2013.01)

(58) Field of Classification Search
CPC ............. G06F 11/1044; G06F 11/1048; G06F 11/106; G11C 11/406; G11C 11/4062; G11C 11/4068; G11C 29/42; G11C 29/52
See application file for complete search history.

(56) References Cited

U.S. PATENT DOCUMENTS

| | | | | |
|---|---|---|---|---|
| 6,199,139 | B1 * | 3/2001 | Katayama | ............. G06F 1/3275 |
| | | | | 714/764 |
| 9,984,768 | B2 * | 5/2018 | Hyun | .................. G06F 11/1044 |

(Continued)

FOREIGN PATENT DOCUMENTS

| | | |
|---|---|---|
| JP | 2023024008 A | 2/2023 |
| KR | 20220096077 A | 7/2022 |

OTHER PUBLICATIONS

International Search Report and Written Opinion for International Application No. PCT/US2024/035650, mailed Oct. 31, 2024, 08 pages.

*Primary Examiner* — Joseph O Schell
(74) *Attorney, Agent, or Firm* — Lowenstein Sandler LLP

(57) ABSTRACT

A system can include a memory device and a processing device, operatively coupled with the memory device, to perform operations including storing a set of user data and multiple portions of error correction data. The operations can also include, responsive to an expiration of a first threshold amount of time after storing the set of user data, performing, using the third portion of the error correction data, a first error correction operation, on each of the set of user data, the first portion, and the second portion, and rewriting, on the memory device, the set of user data, the first portion, and the second portion. The operations can further include deleting the third portion.

20 Claims, 8 Drawing Sheets

(56) References Cited

U.S. PATENT DOCUMENTS

| | | | |
|---|---|---|---|
| 2003/0021149 A1* | 1/2003 | So | G11C 16/10 |
| | | | 365/185.03 |
| 2015/0169398 A1* | 6/2015 | Chunn | G06F 11/3034 |
| | | | 714/763 |
| 2018/0081570 A1* | 3/2018 | Abe | G06F 3/0616 |
| 2019/0006001 A1* | 1/2019 | Chun | G06F 11/073 |
| 2021/0119647 A1* | 4/2021 | Lee | H03M 13/616 |
| 2023/0035529 A1 | 2/2023 | Ginty | |
| 2023/0096375 A1 | 3/2023 | Confalonieri et al. | |
| 2023/0112396 A1 | 4/2023 | Giri et al. | |
| 2023/0153198 A1* | 5/2023 | Huang | G06F 3/0679 |
| | | | 714/723 |
| 2024/0152279 A1* | 5/2024 | Tseng | G11C 16/10 |
| 2024/0386974 A1* | 11/2024 | Lien | G11C 11/5628 |

* cited by examiner

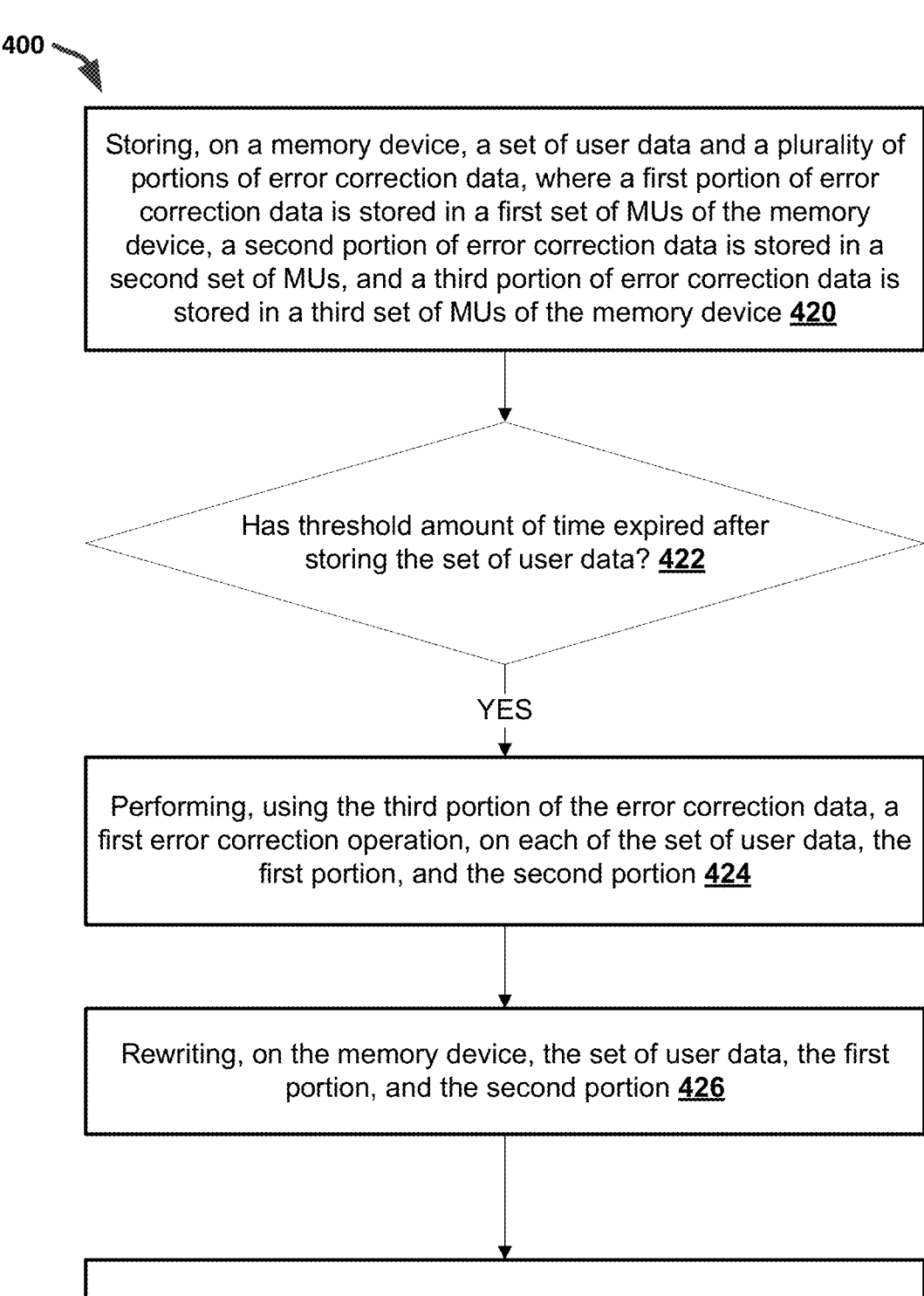

400

Storing, on a memory device, a set of user data and a plurality of portions of error correction data, where a first portion of error correction data is stored in a first set of MUs of the memory device, a second portion of error correction data is stored in a second set of MUs, and a third portion of error correction data is stored in a third set of MUs of the memory device 420

Has threshold amount of time expired after storing the set of user data? 422

YES

Performing, using the third portion of the error correction data, a first error correction operation, on each of the set of user data, the first portion, and the second portion 424

Rewriting, on the memory device, the set of user data, the first portion, and the second portion 426

Deleting the third portion of error correction data 428

FIG. 4

500A

Storing, on a memory device, a set of user data and a plurality of portions of error correction data, where a first portion of error correction data is stored in a first set of MUs of the memory device, a second portion of error correction data is stored in a second set of MUs, and a third portion of error correction data is stored in a third set of MUs of the memory device 520

Has threshold amount of time expired after storing the set of user data? 522

YES

Performing, using the third portion of the error correction data, a first error correction operation, on the set of user data, the first portion, and the second portion 524

Rewriting, on the memory device, the set of user data, the first portion, and the second portion 526

Deleting the third portion of error correction data 528

Has second threshold amount of time expired after storing the set of user data? 530

YES

Performing, using the second portion of the error correction data, a second error correction operation, on each of the set of user data and the first portion 532

Rewriting, on the memory device, the set of user data and the first portion 534

Deleting the second portion of error correction data 536

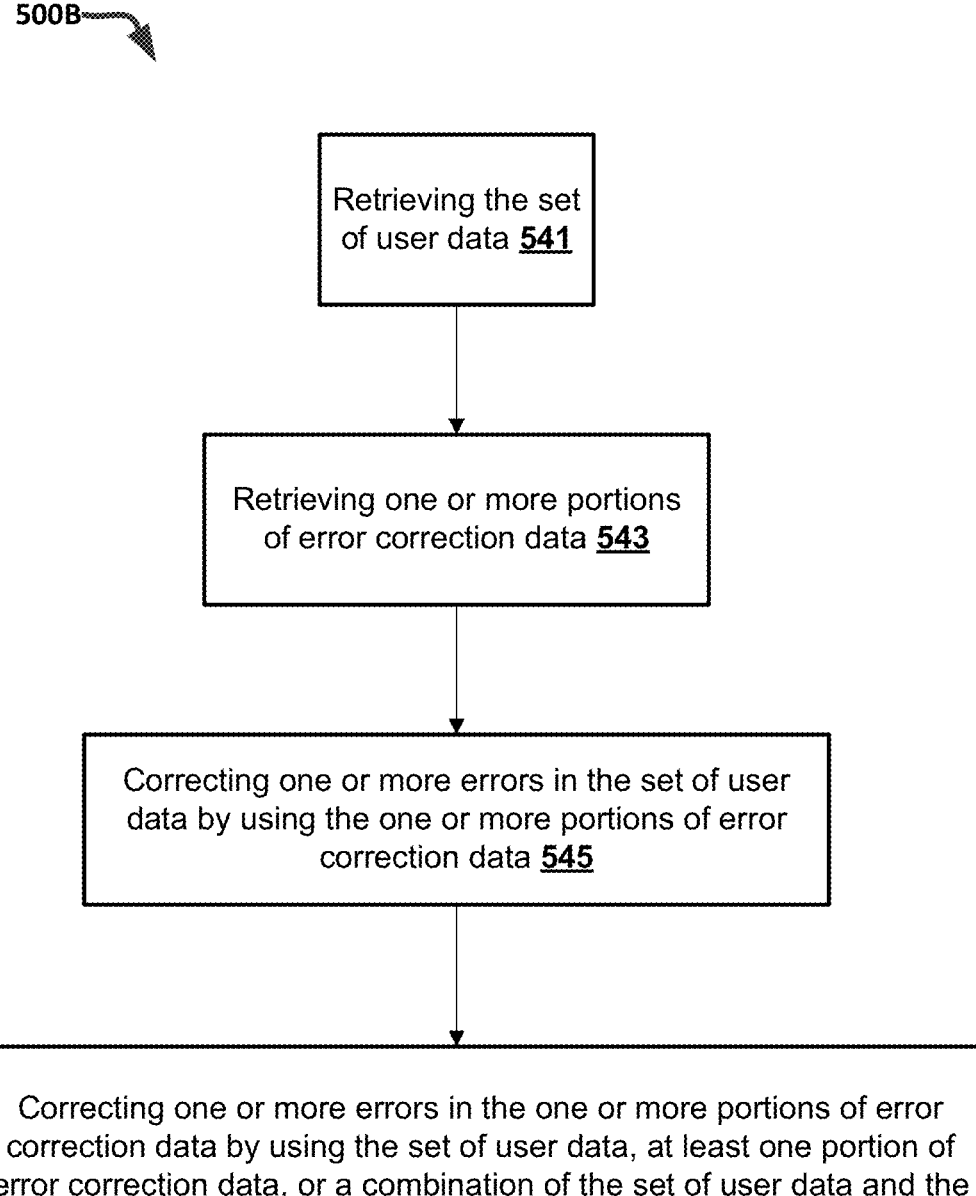

Retrieving the set
of user data 541

Retrieving one or more portions
of error correction data 543

Correcting one or more errors in the set of user
data by using the one or more portions of error
correction data 545

Correcting one or more errors in the one or more portions of error
correction data by using the set of user data, at least one portion of
error correction data, or a combination of the set of user data and the
at least one portion of error correction data 547

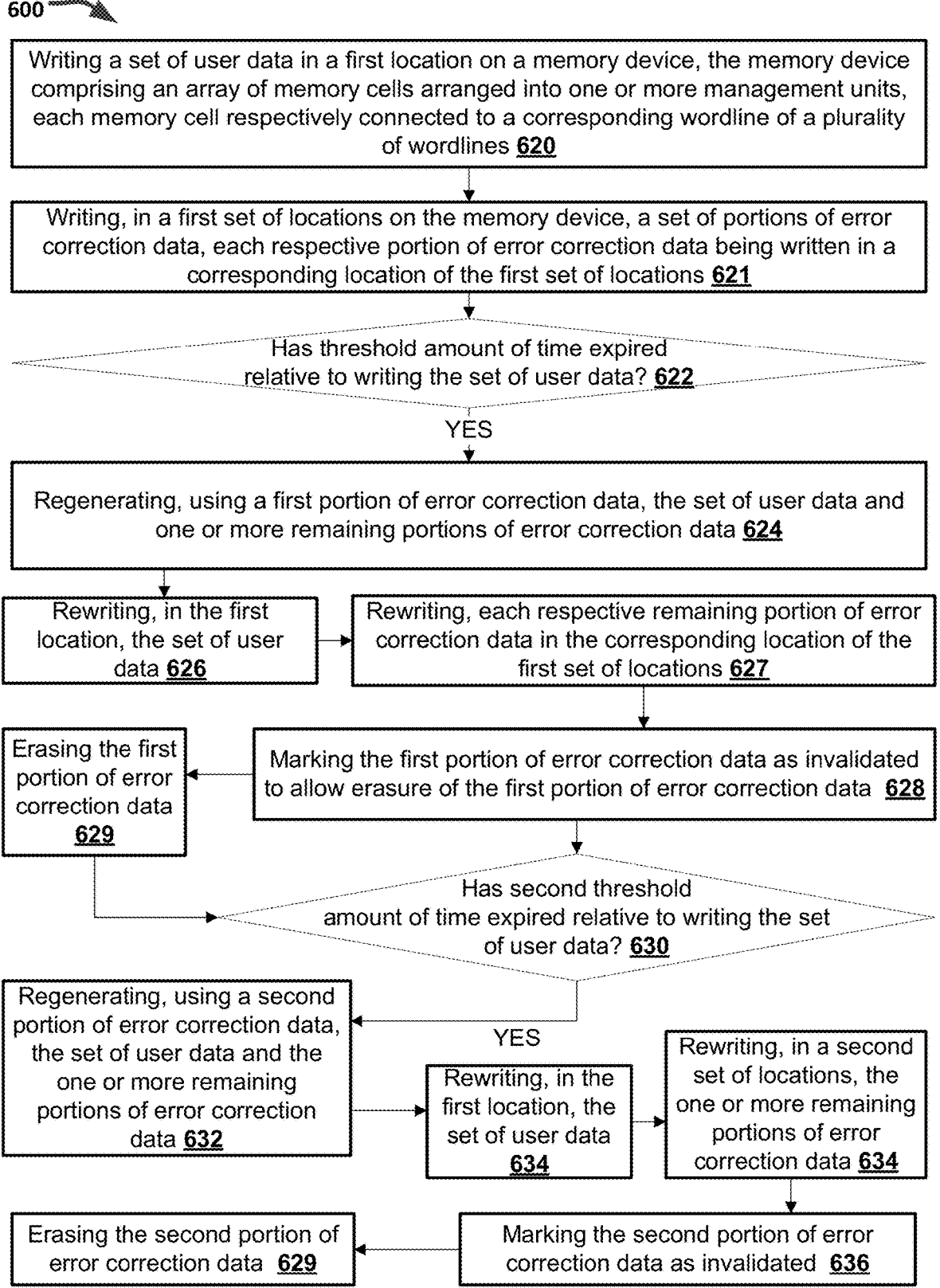

Writing a set of user data in a first location on a memory device, the memory device comprising an array of memory cells arranged into one or more management units, each memory cell respectively connected to a corresponding wordline of a plurality of wordlines 620

Writing, in a first set of locations on the memory device, a set of portions of error correction data, each respective portion of error correction data being written in a corresponding location of the first set of locations 621

Has threshold amount of time expired relative to writing the set of user data? 622

YES

Regenerating, using a first portion of error correction data, the set of user data and one or more remaining portions of error correction data 624

Rewriting, in the first location, the set of user data 626

Rewriting, each respective remaining portion of error correction data in the corresponding location of the first set of locations 627

Erasing the first portion of error correction data 629

Marking the first portion of error correction data as invalidated to allow erasure of the first portion of error correction data 628

Has second threshold amount of time expired relative to writing the set of user data? 630

Regenerating, using a second portion of error correction data, the set of user data and the one or more remaining portions of error correction data 632

YES

Rewriting, in the first location, the set of user data 634

Rewriting, in a second set of locations, the one or more remaining portions of error correction data 634

Erasing the second portion of error correction data 629

Marking the second portion of error correction data as invalidated 636

FIG. 6

DATA PROTECTION WITH TIME-VARYING IN-SITU DATA REFRESH

RELATED APPLICATIONS

This application claims the benefit of U.S. Provisional Patent Application No. 63/525,113, filed Jul. 5, 2023, the entire contents of which are hereby incorporated by reference herein.

TECHNICAL FIELD

Embodiments of the disclosure relate generally to memory sub-systems, and more specifically, relate to managing refreshing of data on memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a flow diagram of an example method for performing time-varying in-situ data refresh management on memory devices in accordance with some embodiments of the present disclosure;

FIG. 5A is a flow diagram of an example method for performing time-varying in-situ data refresh on memory devices in accordance with some embodiments of the present disclosure;

FIG. 5B is a flow diagram of an example method for performing error correction on memory devices in accordance with some embodiments of the present disclosure;

FIG. 6 is a flow diagram of an example method for performing time-varying in-situ data refresh on memory devices in accordance with some embodiments of the present disclosure.

DETAILED DESCRIPTION

Figure 1:
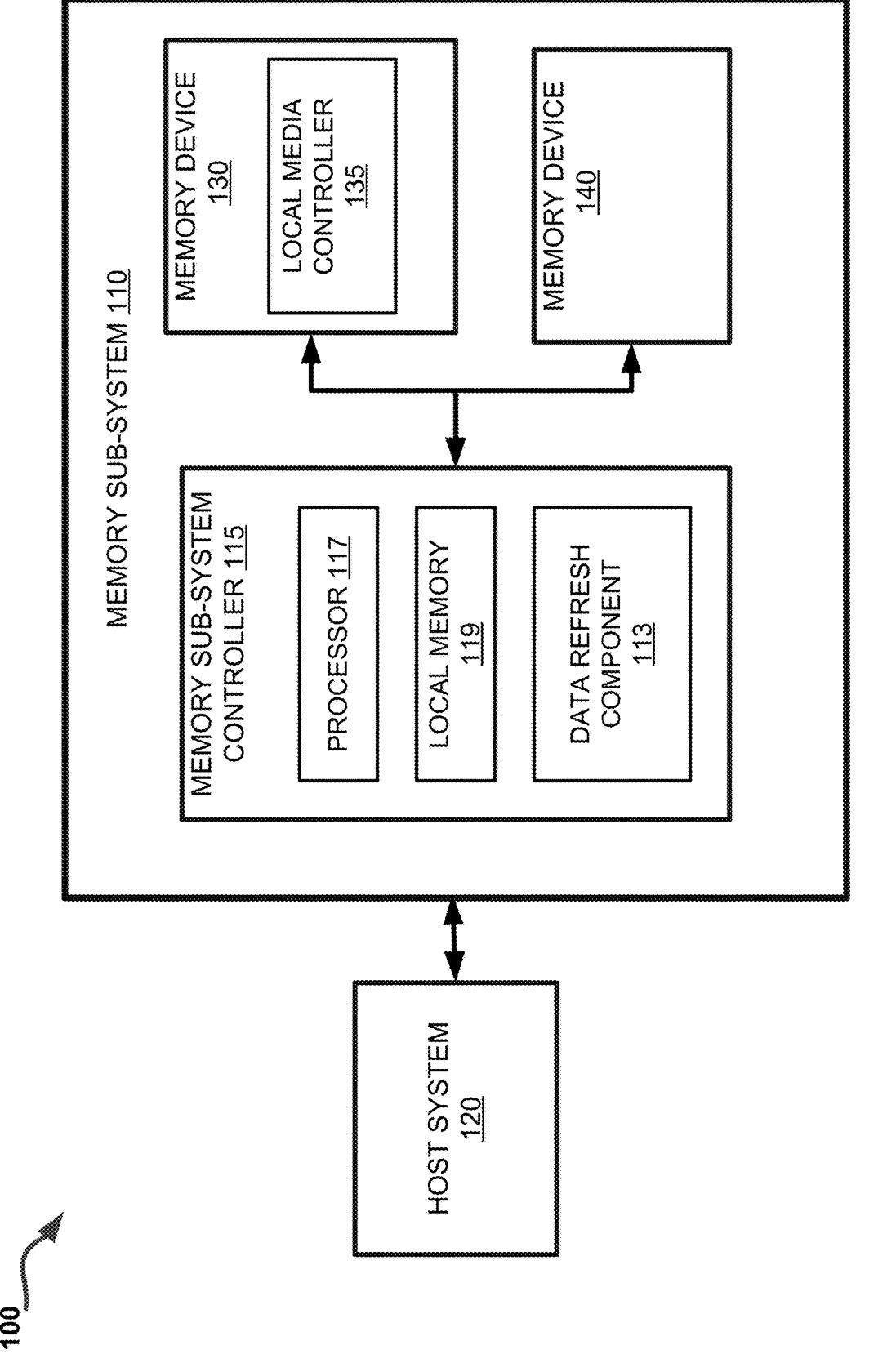
FIG. 1 illustrates an example computing system that includes a memory sub-system in accordance with some embodiments of the present disclosure.

Aspects of the present disclosure are directed to managing time-varying in-situ refreshing of data on memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include of one or more planes. For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or three-dimensional grid. Memory cells can be formed on a silicon wafer in an array of columns connected by conductive lines (also hereinafter referred to as strings, bitlines, or BLs) and rows connected by conductive lines (also hereinafter referred to as wordlines or WLs). A wordline can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

In a memory device, a cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG} < V_t$. The current increases substantially, once the control gate voltage has exceeded the threshold voltage, $V_{CG} > V_t$. Because the actual geometry of the electrodes and gates varies from cell to cell, the threshold voltages can be different even for cells implemented on the same die. The cells can, therefore, be characterized by a distribution P of the threshold voltages, $P(Q,V_t) = dW/dV_t$, where dW represents the probability that any given cell has its threshold voltage within the interval $[V_t, V_t + dV_t]$ when charge Q is placed on the cell.

A programming operation can be performed by applying a series of incrementally increasing programming voltage pulses that to the control gate of a memory cell being programmed. When the applied voltage reaches the threshold voltage of the memory cell, the memory cell turns on and sense circuitry detects a current on a bit line coupled to the memory cell. The detected current activates the sense circuitry which can determine whether the present threshold voltage is greater than or equal to the target threshold voltage. If the present threshold voltage is greater than or equal to the target threshold voltage, further programming is not needed. Otherwise, programming continues in this manner with the application of additional program pulses to the memory cell until the target $V_t$ and data state is achieved.

Precisely controlling the amount of the electric charge stored by the cell allows multiple logical levels to be distinguished, thus effectively allowing a single memory cell to store multiple bits of information. One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "00" or "L2" and "01" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "011" or "L1", "001" or "L2", "000" or "L3", "010" or "L4", "110" or "L5", "100" or "L6", and "101" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "1011". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window (i.e., a size measured in volts, representing the distance, on a voltage scale, between a Vt distribution associated with one programming level and a Vt distribution associated with a subsequent programming level). For example, in a SLC cell, there is one read window that exists with respect to the two Vt distributions. Analogously, in an MLC cell, there are three read windows that exist with respect to the four Vt distributions. Similarly, in a TLC cell, there are seven read windows that exist with respect to the eight Vt distributions. Read window size generally decreases as the number of states increases. For example, the one read window for the SLC cell may be larger than each of the three read windows for the MLC cell, and each of the three read windows for the MLC cell may be larger than each of the seven read windows for the TLC cell, etc. Read window budget (RWB) refers to the cumulative value of the read windows (i.e., the total size of all the read windows of a set of memory cells).

A memory cell can be read by applying a ramped voltage to the control gate of the memory cell. If the applied voltage is equal to or greater than the threshold voltage of the memory cell, the memory cell turns on and sense circuitry can detect a current on a bit line coupled to the memory cell. The detected current activates the sense circuitry, which determines the present threshold voltage of the cell. Accordingly, certain non-volatile memory devices can use a demarcation voltage (i.e., a read reference voltage) to read data stored at memory cells. For example, when a read reference voltage (also referred to herein as a "read voltage") is applied to the memory cells, if a $V_t$ of a specified memory cell is identified as being below the read reference voltage that is applied to the specified memory cell, then the data stored at the specified memory cell can be read as a particular value (e.g., a logical '1') or determined to be in a particular state (e.g., a set state). If the $V_t$ of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or reflect a normal distribution of threshold voltages.

In some memory sub-systems, a read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, (triple-level cell) TLC memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

In certain multi-plane memory devices such as memory devices with memory cells arranged in an array ("a memory array") of worldliness and bitlines, there can be a one-to-one correspondence between a memory array associated with each plane and other related circuitry, such as for example, an independent plane driver circuit, with bitline bias circuitry, a sense amplifier, and a number of registers. In some cases, the independent plane driver circuits allow for parallel and concurrent memory access operations to be performed on the respective memory arrays of each plane of the multi-plane memory device. In devices capable of such parallelism, the logical address space mapped to physical locations on the memory device can include multiple management units (MUs), such that, as explained in more detail below, each MU can include one or more data-storing elements. Each of these data-storing elements, such as cells (e.g., connected within an array of WLs and BLs), pages, blocks, planes, dies, and combinations of one or more of the foregoing elements, can be referred to as "data-storage units". For the purposes of this disclosure, in the context of two data-storage units, the data-storage unit that can include or subsume the other data-storage unit can be referred to as the "higher-order data-storage unit". Similarly, in the same context, storage unit that can be included in or subsumed by the other data-storage unit can be referred to as the "lower-order data-storage unit". In some examples, an MU can be an addressable data-storage unit that includes a predefined number of smaller addressable data-storage units of an order that is lower than the MU.

Memory devices can be manufactured with certain imperfections and can develop defects in their components over time. In many circumstances, memory devices face challenges in terms of wear and degradation, primarily caused by repeated program/erase (P/E) cycles, which can often affect the device's performance, reliability, and lifespan. Various factors and physical phenomena can contribute to this wear and degradation. For example, since memory cells in memory devices are spaced very close together they can experience a phenomenon called Inter-cell Interference (ICI) where the electrical activity in one cell can affect the neighboring cells, resulting in undesirable voltage level shifts and interference. Furthermore, due to the repeated P/E cycles, groups of memory cells can experience shifts in their $V_t$ distributions as the threshold voltage of memory cells changes over time, leading to overlapping and less distinguishable voltage levels that represent stored data. Repeated P/E cycles can also result in charge trapping within the memory cells' insulating layers, causing erratic behavior, and further contributing to $V_t$ shifts. Another detrimental phenomenon leading to degradation is referred to as cell-to-cell (C2C) coupling where the charge stored in one memory cell can unintentionally leak into a neighboring cell due to the close proximity of the cells. This can occur due to the electric fields generated by the charged cells, which can cause a transfer of charge to adjacent cells. This unintentional transfer of charge can lead to data corruption or loss, reducing the reliability of the memory and the data retention rates of the memory device. Lateral charge loss (LCL) is another phenomenon that can occur in NAND flash memory. It refers to the phenomenon where the charge stored in a memory cell can unintentionally leak out laterally to adjacent cells due to the inherent capacitance between the cells. This can occur during the programming or erasing of the memory, leading to a loss of charge and potential data corruption or loss.

Accordingly, over time and under various environmental and operating conditions, these and other phenomena can affect the components of the memory device leading to data loss and degradation in data retention capabilities. For example, an MU or a lower-order data-storage unit can become defective such that the memory device cannot reliably read data from the component. These phenomena collectively impact the RWB, which can be a key metric for evaluating memory device reliability. For example, when some of these effects are considered for a set of multiple cells in one or more memory arrays on a memory device, these phenomena can result in a lowering and widening of the $V_t$ distribution for any programmed state and therefore impair the ability to accurately read the cells. The $V_t$ distribution widening can, in turn, cause RWB degradation and negatively affect memory device reliability. For example, RWB degradation can lead to an increase in the number of errors (e.g., bit errors) and/or error rate (e.g., bit error rate (BER)). Thus, a reduced RWB is associated with higher BERs, degraded data retention, and lower device longevity.

In many systems the effects of some or all of the aforementioned phenomena can cause the RWB to decrease logarithmically with time (after data is initially written to the memory device) and increase the occurrence of errors to the point until the user data cannot be reliably read back. In these cases, error correction techniques and redundancy data can be used to address the accumulation of errors and degradation of the user data. These techniques can include implementing advanced error correction codes (ECC) such as Low-Density Parity-Check (LDPC) codes, as described in more detail below, and performing an In-Field Touch-Up (IFTU) on the areas of the memory device exhibiting errors to mitigate the impact of these phenomena. IFTU refers to a technique used to correct errors in memory devices by applying additional programming pulses to specific memory cells that have experienced errors to accurately restore their programmed state. IFTU can be used to bring a memory cell or an MU of a memory device back into its originally programmed state and recover the RWB that has been lost since the time that the data was originally programmed in that memory cell or MU. For the purposes of this disclosure, an IFTU can be referred to as a data refresh operation and as an error correction operation.

ECC refers to a technique that can be used to detect and correct errors that may occur during the storage or retrieval of data from the memory. In some systems, ECC works by adding redundant information (e.g., redundancy data, error correction data) to the data before it is stored in the memory. This redundant error correction information can be calculated using a mathematical algorithm that generates parity bits, which are added to the data. When the data is read back from the memory, the parity bits are used to detect any errors that may have occurred during storage or retrieval. If errors are detected, the ECC algorithm can use the redundant error correction information to correct the errors and recover the original data.

The ECC algorithm can be implemented using various codes, such as Hamming code, Reed-Solomon code, or Low-Density Parity-Check (LDPC) code. These codes have different characteristics in terms of error detection and correction capabilities, as well as complexity and overhead. For example, LDPC codes are a class of error-correction codes that implement a parity-check matrix that is used to add redundancy to the data and can be used as an alternative to the parity bits used by ECC. Like ECC, LDPC codes also add redundant data to the original data, but they use a different method for detecting and correcting errors.

Whether in the context of ECC or LDPC, a code rate refers to a measure of the amount of error correction data added to the original data compared to the total amount of data, including both original data and error-correction bits. The code rate (CR) can be expressed as a ratio $$CR = \frac{(\text{amount of host data on MU})}{\substack{(\text{amount of host data on MU} + \\ \text{amount of error correction data on MU})}},$$

such as 1/2, 2/3, or 3/4. A lower code rate is indicative of more redundancy being added, which increases the ability to detect and correct errors, but also increases the amount of data that needs to be transmitted or stored. Accordingly in the context of code rates being compared, a lower code rate would be representative of a larger proportion of redundancy/parity/error-correction data being added relative to the host data, while a higher code rate would be representative of a smaller proportion of redundancy/parity/error-correction data being added relative to the host data.

However, while lower code rates can result in better error correction capabilities, they also entail a higher overhead cost caused by the additional error-correction data being added. This error-correction data can reduce the effective storage capacity of the device, as more error-correction data bits need to be stored for each unit of data. Moreover, although error correction operations (e.g., IFTUs) can restore memory cells to their originally programmed states, the data continues to degrade as it continues to be subject to the aforementioned detrimental effects even after the performance of an error correction operation. Notably, memory device systems often have to meet pre-determined data retention requirements and to be able to maintain a level of quality (e.g., as measured by a reliability metric, a range of tolerated operating conditions, and a measure of effective data capacity). Accordingly to meet such requirements and levels of quality, systems can rely on performing error correction operations with a corresponding frequency to maintain RWB above a threshold target level or can rely on maintaining an adequate amount of error-correction data on the device to perform error correction operations to maintain the RWB above the threshold target level. However, both of these approaches suffer from significant drawbacks. In many systems employing a certain amount of error-correction data, due to bandwidth and power constraints, error correction operations cannot be performed frequently enough to maintain the RWB at the desired level and ensure data recoverability until the next time that an error correction operation can be performed. Conversely, in systems that employ a larger amount of error-correction data with which host data is initially written to the memory device to enable a lower frequency of (i.e., longer periods between) error correction operations that refresh the data, the effective data capacity of the memory device is significantly reduced.

Aspects of the present disclosure address the above and other deficiencies by using different types and amounts of error-correction data that enables varying the frequency with which error correction operations are performed to refresh the user data. In the various embodiments disclosed herein, user data can be written to the memory device along with multiple portions of error-correction data associated with it.

Each portion of error-correction data can respectively be of a different type and can respectively be saved in different locations on the memory device. Based on experimentally known rates of data degradation, error correction operations can be performed on the areas of memory device where the user data and the error-correction data are stored with a predetermined frequency to maintain a target RWB level. Error correction operations can be performed on both the user data as well as on the error-correction data on the memory device. Accordingly, in the various embodiments disclosed herein, each error correction operation can use a portion of the error-correction data to refresh both the data as well as the remaining portions of its redundancy data. After each error correction operation, once the user data and the other portions of the error-correction data have been refreshed (i.e., reprogrammed to their original state), the portion of the error-correction data that was used to perform the error correction operation can be deleted. Because the RWB decreases logarithmically after data is programmed to an area of the memory device, each subsequent refresh of data by the error correction operation enables the data to be reliably stored on the device for an exponentially longer period of time. Accordingly, by using multiple portions of error-correction data and by erasing a portion of error-correction data after it was used for an error correction operation, the various embodiments described herein enable the maintenance of the target RWB level while gradually increasing the effective capacity of the memory device by periodically deleting portions of the error-correction data.

Advantages of the present disclosure include having a memory sub-system that balances data retention objectives with effective data storage capacity within the constraints that a memory device may be subject to with respect to bandwidth, available power, and other operating conditions. For example, the various embodiments can provide the benefit of being able to maintain target RWB levels while minimizing the impact on the effective storage capacity of the memory device. Through the use of multiple portions of error-correction data, stored in different locations and of varying types, these embodiments can adaptively perform error correction operations based on known rates of data degradation. Moreover, the described embodiments can gradually increase the effective capacity of the memory device by periodically deleting portions of the error-correction data after each error correction operation. Consequently, these embodiments facilitate the maintenance of a high level of data reliability and integrity, without compromising on the device's storage capabilities. More specifically, the various aspects of the embodiments described herein allow for the maintenance of the target RWB level while optimizing the effective capacity of the memory device, providing a more efficient and reliable solution for memory device systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dies and/or channels to form management units (MUs). In some embodiments, an MU can refer to a memory cell, a set of cells connected to a wordline, a page, a block, or a combination of one or more of the foregoing. An MU can refer to set of one or more individual data-storage units of the memory device 130 that can be written or erased in a single operation. For example, memory device 130 can be divided into multiple MUs, where each MU includes one or more blocks. An MU containing a predefined total number of usable blocks where each block is located on a different plane of a memory device 130 can be referred to as a super block.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a data refresh component (DRC) 113 that can perform data access and management operations on the memory device 130. In some embodiments, the DRC 113 can read data from and write data to the memory device 130. For example, DRC 113 can perform error correction operations on user data and on error-correction data with a varying frequency over a duration of a period of time to refresh the memory device 130. In some embodiments, the memory sub-system controller 115 includes at least a portion of the data refresh component 113. In some embodiments, the data refresh component 113 is part of the host system 120, an application, or an operating system. In other embodiments, local media controller 135 includes at least a portion of data refresh component 113 and is configured to perform the functionality described herein.

The DRC 113 can, in some embodiments, operate in conjunction with the memory device 130 that can have the following hierarchy of components: the memory device can contain one or more dies; each die can have one or more planes; each plane can include one or more blocks; each block can contain pages of memory cells arranged into arrays of intersecting wordlines and bitlines. As noted, in several embodiments, multiple lower-order data-storage units (e.g., cells) can be grouped together to form higher-order data-storage units (e.g., pages) on the memory device 130. For example, blocks on the memory device 130 can be grouped together into super blocks. The present disclosure may highlight some embodiments where the higher-order data-storage units (i.e., $Unit_1$) are represented by pages (i.e., MUs) that are formed from respective groups of lower-order data-storage units (i.e., $Unit_2$) that are represented by memory cells (i.e., embodiments where relationships between higher-order data-storage units and lower-order data-storage units are represented by the relationships between memory cells and pages). In other embodiments, analogous relationships are contemplated with respect to other $Unit_1$:$Unit_2$ pairs in the hierarchy (i.e., relationships between $Unit_1$:$Unit_2$ pairs such as die:plane, die:block, dies: page, die:cell array, die:cell, super block:block, super block: page, super block:cell array, super block:cell, block:page, block:cell array, block:cell, plane:block, plane:page, plane: cell array, plane:cell, block:page, block:cell array, block: cell, page:half-page, page:cell array, page:cell, block:wordline, plane:block-and-page-combination, super block:page-and-cell-combination, die:page-and-cell-array-combination, etc.).

Accordingly, in the several embodiments, the DRC 113 can write data to one or to multiple memory devices 130, 140. For example, DRC 113 can write data, such as data received by the memory sub-system 110 from host 120 (such data referred to herein as "host data") and metadata such as redundancy, parity, and error-correction data created by the memory-sub-system 110 (such data referred to herein as "error-correction data") to the memory device 130. For the purposes of this disclosure, host data and other data created by the memory sub-system 110, other than the error-correction data, can collectively be referred to as "user data". In the memory sub-system 110, the DRC 113 can write data to the memory device 130 by storing the user data on the memory device 130 along with error-correction data (i.e., redundant duplicated portions of the system data or redundancy metadata (e.g., parity metadata)). In some embodiments, the DRC 113 can store the error-correction data in the same location (e.g., same MU (i.e., same wordline, page, plane, block, die, etc.)) on the memory device as the user data, while in other embodiments, the DRC 113 can store user data in one location (e.g., an area on memory device 130)

and store corresponding error-correction in a different location (e.g., in another area on memory device 130).

In some embodiments, the memory device 130 can include an array of memory cells arranged into one or more MUs. In the memory device 130, each memory cell in the array of memory cells can be respectively connected to a corresponding wordline of a plurality of wordlines. Accordingly, for the purposes of this description, writing data to an MU of the memory device refers to writing data to a group of memory cells that make up that MU or are connected to the conductive lines that make up that MU. For example, writing data to a wordline refers to writing data to a group of memory cells connected to that wordline.

Thus, in some embodiments, the DRC 113 can receive a set of user data from the host system 120 or from another component of the memory sub-system 110. The DRC 113 can write the set of user data in a first location on a memory device. For example, DRC 113 can write the set of user data in a particular MU (e.g., page, wordline, block, etc.) on the memory device 130. In some embodiments, the DRC 113 can write a set of portions of error correction data associated with the set of user data in the same location as the user data e.g., in the same MU while in other embodiments, the DRC 113 can write a set of portions of error correction data associated with the set of user data a different location or set of locations. For example, the DRC 113 can write one or more portions of error correction data on the same word line as the user data. In another example, the DRC 113 can write one or more portions of error correction data in a different block than the user data. Thus, each respective portion of error correction data can be written in a corresponding location of the set of locations. In some instances, each portion of the set of one or more portions of error correction data can be written in a different location on the memory device as well. For example, DRC 113 can write one portion of error correction data on the same word line and on the same page as the user data, can write another portion of error correction data in a different page on the same block as the user data on the memory device 130, and can write yet another portion of error correction data on a completely different block on the memory device 130. These and other details with respect to the various features and aspects of the embodiments described herein are further explained with reference to FIGS. 2 and 3 and continued reference to FIG. 1.

Figure 2:
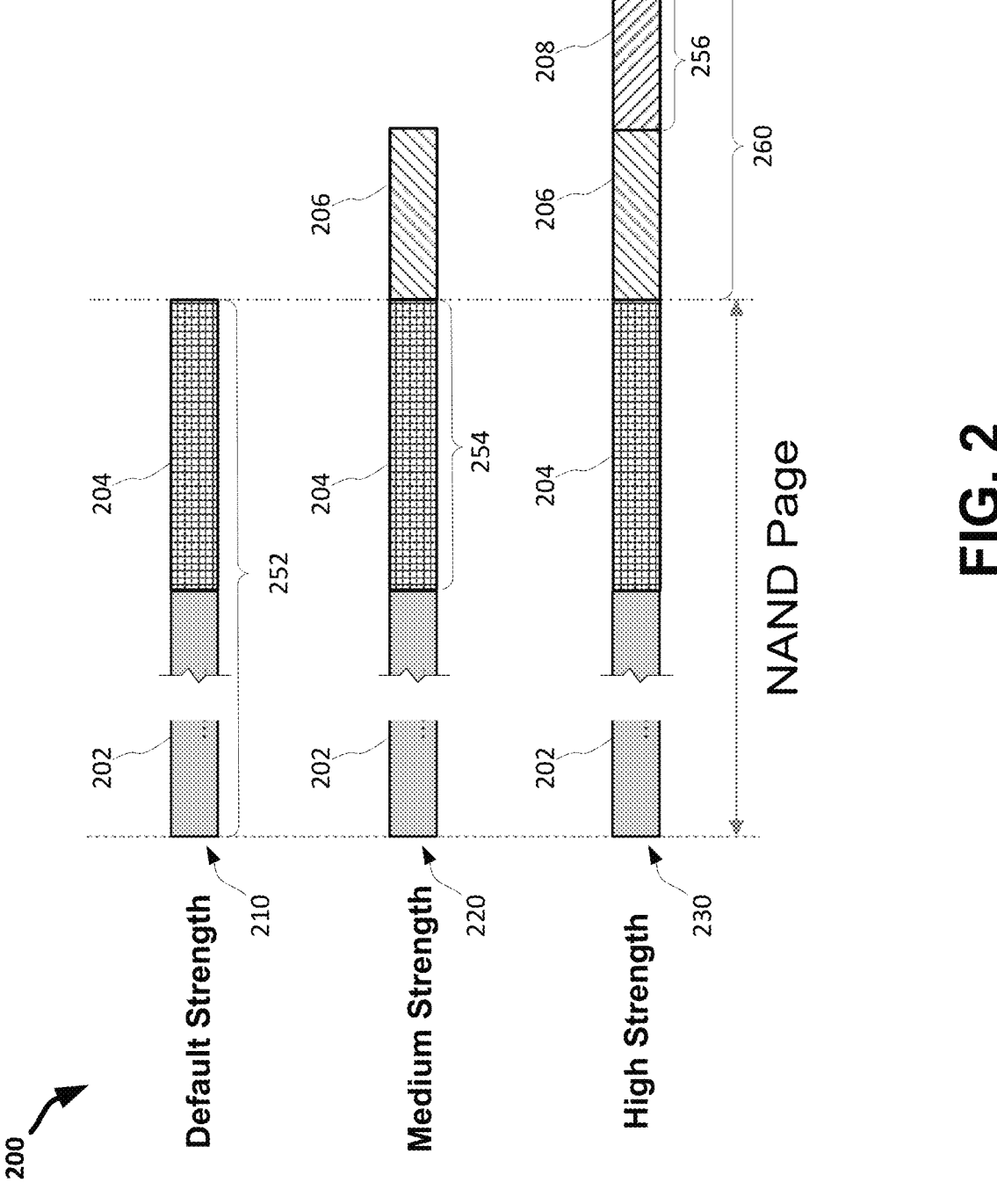
FIG. 2 is a schematic diagram of multiple example data layouts on a memory device in accordance with some embodiments of the present disclosure.

FIG. 2 shows a diagram 200 depicting multiple variants of example data layouts on a memory device in accordance with some embodiments. In one embodiment a variant 210 includes both user data 202 and one portion 204 of error correction data written on the same page and occupying the entirety of the page 252. In another embodiment, the variant 220 includes user data 202 and two portions of error correction data. In variant 220, one portion 204 of error correction data is written and stored on the same page as the user data 202 while another portion 206 of error correction data can be stored elsewhere. For example, this additional error correction data 206 can be written to another page. In a different embodiment, the variant 230 includes user data 202 and three portions 204, 206, 208 of error correction data. In variant 220, one portion 204 of error correction data is written and stored on the same page as the user data 202, while the other portions 206, 208 of error correction data can be stored elsewhere. For example, this additional error correction data 206, 208 can be written to another page. In other examples, each of these additional portions of error correction data can be respectively written in different locations as well. For example, error correction data portion 206 can be written to one block (e.g., a different page on the same block as the user data) while error correction data portion 208 can be written to another block. While three portions of error correction data are discussed herein, various embodiments of the present invention contemplate an arbitrary number of error correction data portions to be stored on one or more locations on the memory device 130.

In the various embodiments the set of portions of error correction data can include error correction data of various types. For example, the error correction data can include parity data, target threshold voltage indication data, and duplicate data, as well as other types of error correction data and combinations of error correction data types. In some embodiments, the set of portions of error correction data can include at least two different types of error correction data, each type of error correction data selected from parity data, target threshold voltage indication data, and duplicate data. In some cases, each portion of error correction data can include multiple types of error correction data, while in other cases each portion of error correction data includes error correction data of exclusively a single type.

In some embodiments, the set of portions of error correction data can include a local portion 254 of error correction data and a remote portion 256, 260 of error correction data. In these embodiments the local portion 254 of error correction data can be written by the DRC 113 to a particular management unit (e.g., page 252 that also includes the set of user data 202). Additionally, the DRC 113 can write the remote portions 256, 260 of error correction data to a different management unit (e.g., another page, plane, block) that can be in a different location than the management unit to which the local portion of error correction data and the set of user data is written on the memory device 130. The utility of these various error correction data portions can be better understood in relation to data degradation described in terms of the effects of time elapsed from the moment of data being written on a remaining read window budget on a portion of a memory device 130.

Figure 3:
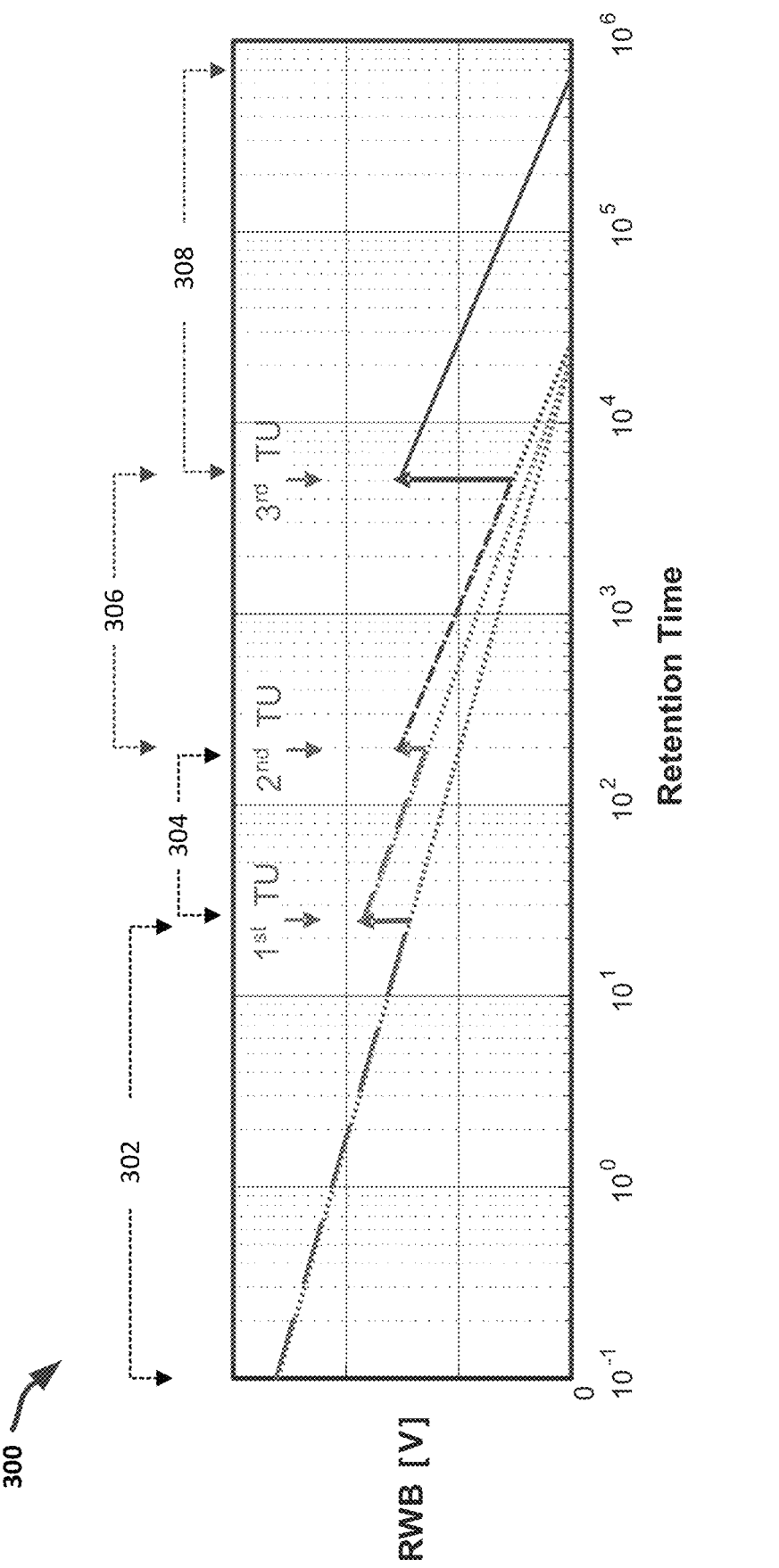
FIG. 3 depicts a graph of a read window budget (RWB) as a function of data retention time on a memory device in accordance with some embodiments of the present disclosure.

Accordingly, FIG. 3 depicts a graph 300 of a read window budget as a function of data retention time on a memory device in accordance with some embodiments of the present disclosure. In some embodiments, upon the expiration of a certain threshold amount of time relative to writing the set of user data, the DRC 113 can regenerate the set of user data 202 and one or more remaining portions 204, 206, 208 of error correction data. In these embodiments, at the end of time period 302, the DRC 113 can use a first portion of error correction data (e.g., remote portion 208 or local portion 204) to recover and regenerate the set of user data 202 and one or more remaining portions of error correction data (e.g., local portion 204 or remote portion 206). For example, in some embodiments, portion 204 of error recovery data can be made up of parity data written on the same wordline as the user data, portion 206 of error recovery data can be made up of target threshold voltage indication data written in a different location but on the same page as the user data, and portion 208 of error recovery data can be made up of duplicate data written on a different block than either of the set of user data 202, portion 204 of error recovery data or portion 206 of error recovery data. In these or other embodiments, the DRC 113 can use error correction data portion 208 to recover and regenerate both the set of user data 202 and one or more remaining portions 206, 208 of error correction data.

For example, in response to the expiration of the predetermined threshold amount of time 302, the DRC 113 can rewrite, in a first location (e.g., an MU, page 252, etc.), the set of user data 202 and can rewrite each respective remaining portion 206 of error correction data in their corresponding location. This process can be referred to as a touch-up operation or a data refresh operation. In some embodiments, the predetermined threshold amount of time 302 can be specified in terms of time (e.g., seconds) elapsed since the writing of the set of user data on the memory device 130. In other embodiments, the predetermined threshold amount of time 302 can be specified in terms of P/E cycles (e.g., a count of completed program and erase operation cycles) that the area of the memory device 130 where the set of user data is written has undergone since the set of user data was written to the memory device. In some other embodiments, the predetermined threshold amount of time 302 can be specified in terms of time elapsed since or in terms of P/E cycles that the area of the memory device 130 where the set of user data is written has undergone since the previous touch-up operation (i.e., data refresh operation) on that area of the memory device. In the various embodiments, the DRC 113 can mark the portion 208 of error correction data that was used to perform error correction (e.g., data recovery or regeneration) as invalidated. Marking a portion of data as invalidated can enable erasure of the portion of data during a subsequent memory management operation being performed on the memory device 130. Accordingly, marking portion 208 of error correction data as invalidated allows the erasure of portion 208 of error correction data. Further, DRC 113 can erase the portion of error correction data that was used (e.g., portion 208 of error correction data) to perform error correction (e.g., data recovery).

Analogously, upon the expiration of a second threshold amount of time 304 (e.g., relative to writing the set of data), the DRC 113 can regenerate the set of user data 202 and any remaining portions 204 of error correction data by using a second portion 206 of error correction data. Similarly, in some embodiments, this second predetermined threshold amount of time 304 can be specified in terms of time (e.g., seconds) elapsed since the writing of the set of user data on the memory device 130. In other embodiments, this second predetermined threshold amount of time 304 can be specified in terms of P/E cycles (e.g., a count of completed program and erase operation cycles) that the area of the memory device 130 where the set of user data is written has undergone since the set of user data was written to the memory device. In some other embodiments, this second predetermined threshold amount of time 304 can be specified in terms of time elapsed since or in terms of P/E cycles that the area of the memory device 130 where the set of user data 202 is written has undergone since the previous touch-up operation (i.e., data refresh operation) on that area of the memory device 130. In some embodiments, DRC 113 can rewrite the set of user data 202 in the first location (i.e., in the MU where it was originally written). The DRC 113 can also rewrite the one or more remaining portions 204 of error correction data in a second set of locations (i.e., in a different MU or set of MUs where those portions of error correction data were originally written) on the memory device 130. In some embodiments, each respective remaining portion 204 of error correction data can be rewritten by the DRC 113 in the corresponding location of the second set of locations. In other words, each respective remaining portion 204 of error correction data can be rewritten by the DRC 113 in a different location than the location where that portion of error correction data was originally written. Further, the DRC 113 can mark the second portion 206 of error correction data that was used to perform error correction (e.g., data recovery or regeneration) as invalidated to allow erasure of that second portion 206 of error correction data. Further, DRC 113 can erase the portion of error correction data that was used (e.g., portion 206 of error correction data) to perform error correction (e.g., data recovery).

In some embodiments, the aforementioned process can recur for as many times as there are portions 204, 206, 208 of error correction data remaining on the memory device associated with the set of user data 202. For example, DRC 113 can perform a third touch-up operation after the expiration of a third predetermined threshold amount of time 306. Accordingly in some embodiments, during time period 302 the set of user data 202 can be stored on the memory device 130 along with three portions of error correction data after which one portion 208 of error correction data can be erased. Consequently, during time period 304 the set of user data 202 can be stored on the memory device 130 along with two remaining portions 204, 206 of error correction data after which one of those remaining portions of error correction data can be erased. Thus, during time period 306 the set of user data 202 can be stored on the memory device 130 along with one remaining portion 204 of error correction data after which that portion of error correction data can be erased so that during time period 308 the data is stored on the memory device 130 without any associated error recovery data. In some systems, the RWB loss curve graph 300 can be dependent on the amount of error-correction data, the capabilities of ECC to correct errors, as well as the reliability requirements of the memory device 130. Accordingly, the threshold time at which the first touch-up operation is performed can be controlled by these factors such that the touch-up operation is performed before the capabilities of ECC to correct the accumulated amount of errors using the stored error correction code data is exceeded.

In some embodiments, to perform the touch-up operation and complete the error correction process, the DRC 113 can regenerate the set of user data 202 and one or more remaining portions 204, 206, 208 of error correction data. In these or other embodiments, regenerating the set of user data 202 and one or more remaining portions 204, 206, 208 of error correction data can include the DRC 113 retrieving the set of user data 202 from the first location and retrieving one or more portions 204, 206, 208 of error correction data, such as the first portion (e.g., portion 208) of error correction data from another location on the memory device 130. Thus, in some embodiments, the DRC 113 can correct one or more errors in the set of user data 202 by using the one or more portions 204, 206, 208 of error correction data. Additionally, the DRC 113 can also correct one or more errors in the one or more portions 204, 206 of error correction data by using the set of user data 202, the first portion of error correction data, or a combination of the set of user data 202 and the first portion of error correction data. In the various embodiments, the error correction data such as parity data, threshold voltage indication data, and duplicate data can be used to determine (e.g., by a comparison or through a logical operation) what the original programmed state of the memory cells exhibiting erroneous bits was and reprogram them to the originally programmed state.

For the purposes of this disclosure each portion of data can be referred to by an ordinal number (e.g., first, fourth, ninth, etc.) for ease of reference and distinction between portions. In the various embodiments the ordinal number identifying a portion can indicate an order in which the portions are written to the memory device. In other embodiments, the ordinal number identifying the portion can indicate the order in which the portions are erased from the memory device. In yet other embodiments, the ordinal number identifying the portion can be dissociated from any order of action with respect to the portion and the simply used for distinguishing one portion from another portion of error correction data in the embodiment.

In various embodiments, the DRC 113 can store a set of user data 202 and multiple portions 204, 206, 208 of error correction data on the memory device 130. In some embodiments, a first portion 208 of the multiple portions of error correction data can be stored in a first set of MUs of the memory device 130, a second portion 206 of the multiple portions of error correction data can be stored in a second set of MUs of the memory device 130, and a third portion 204 of the multiple portions of error correction data can be stored in a third set of MUs of the memory device 130. For example, in some embodiments the third portion 204 of error correction data can be stored on the block and on the same page as the user data 202 on the memory device 130 while the second portion 206 and the third portion 208 of error correction data can be stored on respective pages on a different block on the memory device. In these or other embodiments the third portion 204 of error correction data can be stored on the same wordline as the user data 202 on the memory device 130. In other embodiments, the portions 204, 206, 208 of error correction data can be stored in respective sets of memory cells on the same page as the user data 202 on the memory device 130. Thus, in some embodiments, the first set of MUs can include a first set of memory cells that store the set of user data 202, and a second set of memory cells that store the first portion 204 of error correction data, wherein both the first set of memory cells and the second set of memory cells are connected to the same wordline of the memory device 130.

In some embodiments, responsive to an expiration of a certain pre-determined threshold amount of time after storing the set of user data 202, the DRC 113 can perform one or more error correction operations. The threshold amount of time can be a pre-determined amount specified in terms of minutes or in terms of P/E cycles taking place after the user data 202 is initially stored on the memory device 130. Thus, in some embodiments upon the expiration of this threshold amount of time the DRC 113 can perform a first error correction operation by using the third portion of the error correction data. The first error correction operation can include performing error correction on each of the set of user data 202, the first portion 204, and the second portion 206 of error correction data. In some embodiments, the DRC 113 can rewrite, on the memory device, the set of user data 202, the first portion 204, and the second portion 206 of error correction data. In these or other embodiments, having performed the first error correction operation using the third portion of error correction data, the DRC 113 can delete the third portion of error correction data from the memory device 130.

In some embodiments, responsive to an expiration of another threshold amount of time (e.g., a different amount of time) after storing the set of user data, DRC 113 can perform another error correction operation. This threshold amount of time can also be a pre-determined amount specified in terms of minutes or in terms of P/E cycles taking place after the user data 202 is initially stored on the memory device 130. In some embodiments, the threshold amount of time can be specified in terms of seconds elapsed or P/E cycles performed after the previous error correction operation. In the various embodiments, the pre-determined threshold amounts of time at which each respective error correction operation gets performed can depend on or be calculated on the basis of the total amount of error correction data in the plurality of portions of error correction data present on the memory device 130. Thus, the DRC 113 can perform a second error correction operation on each of the set of user data and the first portion by using the second portion of the error correction data. In these or other embodiments, the DRC 113 can rewrite the set of user data and the first portion of error correction data on the memory device and can also delete the second portion of error correction data from the memory device 130.

In the various embodiments, to perform error correction, the DRC 113 can retrieve the set of user data and retrieve one or more portions of error correction data. The DRC 113 can then correct one or more errors in the set of user data by using the one or more portions of error correction data. In some embodiments, the DRC 113 can correct one or more errors in the one or more portions of error correction data by using the set of user data, at least one portion of error correction data, or a combination of the set of user data and the at least one portion of error correction data. In the various embodiments, the use of any combination of a portion of error correction data and user data to perform an error correction operation is contemplated. These and other aspects of the embodiments described herein are explained in more detail with reference to FIGS. 4-6.

FIG. 4 is a flow diagram of an example method 400 for performing time-varying in-situ data refresh management on memory devices in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 400 can be performed together with or instead of operations of example methods 500A-B and 600 described in more detail below with reference to FIGS. 5A-B and 6. In some embodiments, at operation 420, the processing logic can store, on a memory device, a set of data and multiple portions of error correction data.

In these or other embodiments, the first portion of error correction data Can be stored by the processing logic in a first set of MUs of the memory device, a second portion of error correction data can be stored by the processing logic in a second set of MUs, and a third portion of error correction data can be stored by the processing logic in a third set of MUs of the memory device. Each set of MUs can, in some embodiments respectively be in different locations on the memory device while in other embodiments, each set of MUs can be in the same location (e.g., on the same wordline or on the same page) on the memory device.

In the various embodiments, at operation 422, the processing logic can determine whether a threshold amount of time expired after storing the set of data (i.e., after the set of data was initially stored on the memory device). Having determined, at operation 422, that a threshold amount of time has expired, the processing logic can, at operation 424, perform an error correction operation on the set of user data on the first portion of error correction data as well as on the second portion of error correction data.

In some embodiments, operation 426, the processing logic can rewrite the set of user data, the first portion of error correction data, and the second portion of error correction data on the memory device. Then, the processing logic can, at operation 428, delete the third portion of error correction data.

FIG. 5A is a flow diagram of an example method 500A for performing time-varying in-situ data refresh management on memory devices in accordance with some embodiments of the present disclosure. FIG. 5B is a flow diagram of an example method 500B for performing error correction in accordance with some embodiments of the present disclosure. The methods 500A and 500B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the methods 500A and 500B are performed by the data refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example methods 500A and 500B can be performed together with or instead of operations of example method 400 described earlier and of example method 600 described in more detail below with reference to FIG. 6. In some embodiments, at operation 520, the processing logic can store a set of user data and a plurality of portions of error correction data, such that a first portion of error correction data is stored in a first set of MUs of the memory device, a second portion of error correction data is stored in a second set of MUs, and a third portion of error correction data is stored in a third set of MUs of the memory device.

In the various embodiments, the processing logic can then, at operation 522, determine whether a threshold amount of time has expired after the set of user data has been stored. In some embodiments the threshold amount of time can be a preset or predetermined threshold value specified by a count of seconds and lapsed since the writing of the set of user data. In other embodiments the threshold amount of time can be a preset or predetermined value specified by a count of P/E cycles that a particular MU or a particular area of the memory device has been subjected to since the set of user data was initially written to the memory device.

In some embodiments, in response to determining at operation 522 that the threshold amount of time has expired, the processing logic can use the third portion of error correction data to perform, at operation 524, a first error correction operation. The processing logic can perform that error correction operation on each of the set of user data, the first portion of error correction data, and the second portion of error correction data. In some embodiments, the processing logic can perform that error correction operation on just the set of user data or on just one of the portions of error correction data. The portions of data on which error correction operations are performed can in some embodiments be determined by the presence or absence of memory cells exhibiting bit errors in the MU containing that data. In several embodiments, operation 524 can include method 500B. Accordingly, in these or other embodiments, performing the error correction operation can include the processing logic retrieving at operation 541 the set of user data from the memory device. In these or other embodiments, performing the error correction operation can also include the processing logic retrieving one or more portions of error correction data at operation 543. Performing the error correction operation can also, in some embodiments, include the processing logic correcting, at operation 545 one or more errors in the set of user data by using one or more portions of error correction data. Furthermore, performing the error correction operation can also include the processing logic correcting, at operation 547, one or more errors in the one or more portions of error correction data by using the set of user data or by using a portion of error correction data. It can also include the processing logic correcting one or more errors using a combination of the set of user data and a portion of error correction data.

In some embodiments, at operation 526, the processing logic can rewrite the set of user data the first portion of error correction data and the second portion of error correction data on the memory device. In these or other embodiments, at operation 528, the processing logic can delete the third portion of error correction data.

In the several embodiments, the processing logic can, at operation 530, determine whether another threshold amount of time has expired after storing the set of user data. For example, the processing logic can determine, whether a threshold count of P/E cycles have occurred since the time that the set of user data was initially written to the memory device. In other embodiments, the processing logic can determine whether a threshold count of P/E cycles has occurred since the time that the previous error correction operation was performed. In these or other embodiments, the processing logic can determine whether a threshold count of units of time have elapsed sense the set of user data was written to the memory device.

In response to determining, at operation 530, that a threshold amount of time has expired, the processing logic can at operation 532 perform another error correction operation by using the second portion of error correction data. At operation 532, the processing logic can perform the error correction operation on the set of user data and the first portion of error correction data.

In some embodiments, the processing logic can rewrite the set of user data and the first portion of error correction data on the memory device. For example, the processing logic can rewrite the set of user data and the first portion of error correction data in the same respective MUs they were originally written in on the memory device. In other embodiments, the processing logic can rewrite the set of user data and the first portion of error correction data in different respective MUs than those in which they were originally written.

FIG. 6 is a flow diagram of an example method 600 for performing time-varying in-situ data refresh management on memory devices in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the data refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. Method 600 is further described with continued reference to FIG. 5B.

In several embodiments described herein, operations of example method 600 can be performed together with or instead of operations of example methods 400, 500A, and 500B described earlier. In some embodiments, at operation 620, the processing logic can write a set of user data in a first location on a memory device. The processing logic can, at operation 621, write a set of portions of error correction data in a first set of locations on the memory device. for example, in some embodiments, each respective portion of error correction data can be written in a corresponding location in that first set of locations.

In some embodiments, at operating 622, the processing logic can determine whether a threshold amount of time has expired relative to writing the set of user data. For example, the processing logic can determine whether a threshold count of P/E cycles have been performed since the time that the set of user data was written to the memory device. In another example the processing logic can determine whether a threshold count of units of time has he lapsed since the time that the set of user data was initially written to the memory device.

Responsive to determining that the threshold amount of time has expired at operation 622, the processing logic can, at operation 624, regenerate one or more remaining portions of error correction data and the set of user data by using the first portion of error correction data. In several embodiments, operation 624 can include method 500B. Accordingly, in some embodiments, regenerating, at operation 624, the set of user data and the one or more remaining portions of error correction data can include, at operation 541, the processing logic retrieving the set of user data. It can also include the processing logic retrieving, at operation 543, one or more portions of error correction data, and, correcting, at operation 545, one or more errors in the set of user data by using the one or more portions of error correction data. In some embodiments, regenerating one or more remaining portions of error correction data can include, the processing logic, at operation 547, correcting one or more errors in the portions of error correction data. At operation 547, the processing logic correcting the errors in the portions of error correction data can include using the set of user data or at least one portion of error correction data. In the same or other embodiments, it can also include the processing logic using a combination of the set of user data and one or more portions of error correction data to correct one or more errors.

In some embodiments, at operation 626, the processing logic can rewrite the set of user data and the location in which it was originally written (i.e., the first location) on the memory device. In these or other embodiments, the processing logic can, at operation 627, rewrite each respective remaining portion of error correction data its corresponding respective location. For example, if a portion of error correction data was initially written to the same page that the set of user data was written to while another portion of error correction data was initially written to a different page, the processing logic can rewrite the respective portions of error correction data to those same respective pages. In other embodiments, the processing logic can rewrite the portions of error correction data to different locations on the memory device than those to which those portions of error correction data were originally written.

In the various embodiments, the processing logic can, at operation 628, mark the first portion of error correction data as invalidated to allow erasure of the first portion of error correction data. Then, at operation 629, the processing logic can erase that first portion of error correction data. Having erased, at operation 629, the first portion of error correction data, the processing logic can at operation 630 determine whether another threshold amount of time has expired relative to writing the set of user data. For example, the processing logic can determine whether a threshold count of P/E cycles have been performed since the time that the set of user data was written to the memory device. In another example the processing logic can determine whether a threshold count of units of time has he lapsed since the time that the set of user data was initially written to the memory device. In other embodiments, For the processing logic can determine whether a threshold count of P/E cycles have been performed since the last time that an error correction operation was performed on the set of user data. In another example, the processing logic can determine whether a threshold count of units of time has elapsed since the time the previous error correction operation was performed.

Having determined, at operation 630, that the specified threshold amount of time has expired the processing logic can, at operation 632, regenerate the set of user data and one or more remaining portions of error correction data by using the second portion of error correction data. In some embodiments, at operation 634, the processing logic can rewrite the set of user data in the first location (i.e., the location to which it was originally written) on the memory device. In other embodiments, the processing logic can rewrite the set of user data in a different location than that to which it was originally written on the memory device. In these or other embodiments, the processing logic can, at operation 634, rewrite the one or more remaining portions of error correction data in a second set of locations (i.e., a different set of locations than those to which they were originally written to). In some embodiments, the processing logic can rewrite the remaining portions of error correction data to the same set of locations to which they were originally written. At operation 634, the processing logic can mark the second portion of error correction data as invalidated to permit it to be erased during a subsequent memory management operation on the memory device. In some embodiments, at operation 629, the processing logic can erase the second portion of error correction data. In the various described embodiments, the processing logic can perform the operations described herein an arbitrary number of times dependent on the number of error correction data portions stored on the memory device. For each portion of error correction data stored on the memory device the processing logic can repeat one or more of the aforementioned steps or procedures.

Figure 7:
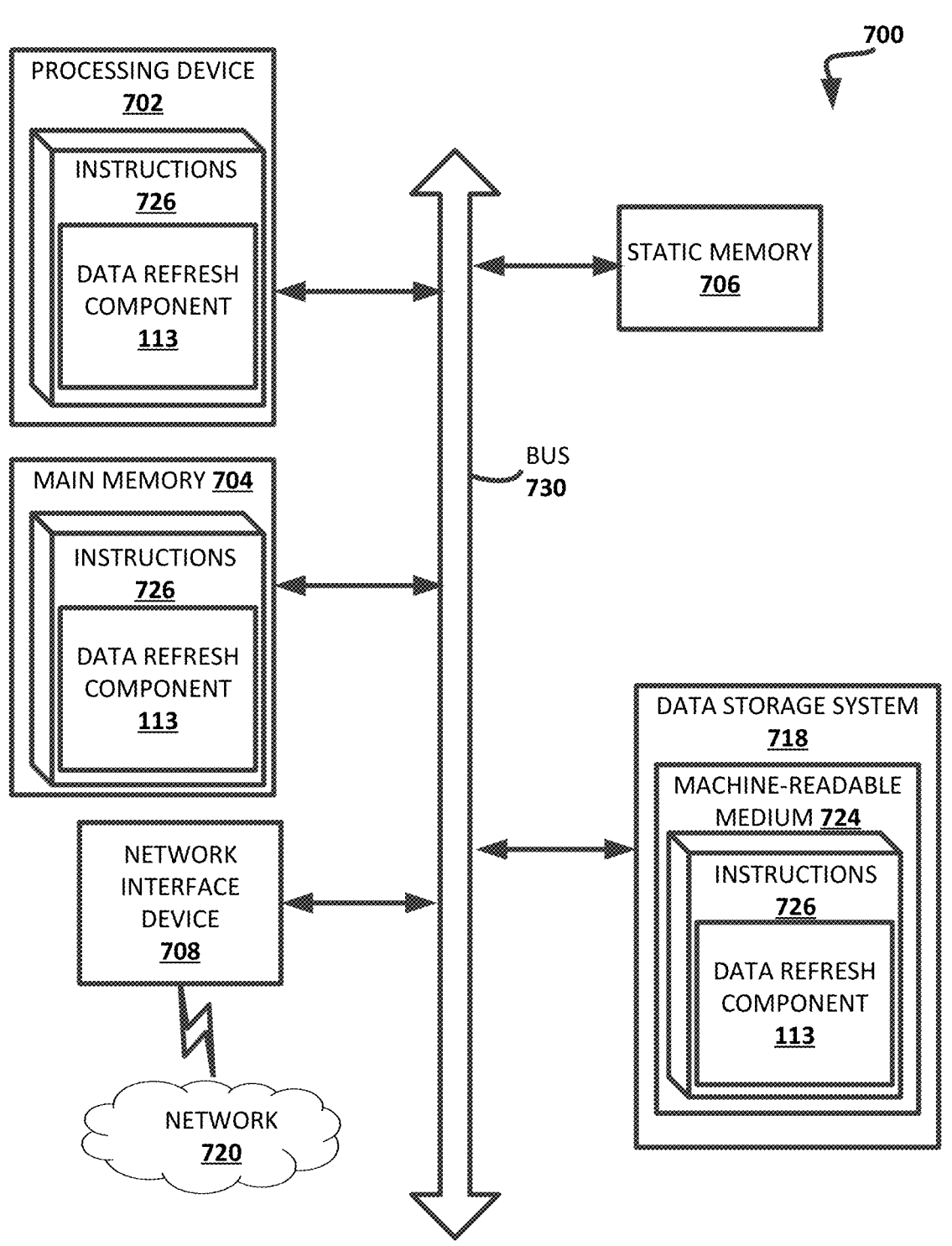
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data refresh component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a data refresh component (e.g., the data refresh component 113 of FIG. 1). In some embodiments the instructions 726 include instructions to implement functionality corresponding to the methods described herein (e.g., the methods 400, 500A, 500B, and 600, respectively of FIGS. 1-6) While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising an array of memory cells arranged into one or more management units (MUs), wherein each memory cell in the array of memory cells is respectively connected to a corresponding wordline of a plurality of wordlines; and
a processing device, operatively coupled with the memory device, to perform operations comprising:
storing, on the memory device, a set of user data and a plurality of portions of error correction data, wherein a first portion of the plurality of portions of error correction data is stored in a first set of MUs of the memory device, a second portion of the plurality of portions of error correction data is stored in a second set of MUs of the memory device, and a third portion of the plurality of portions of error correction data is stored in a third set of MUs of the memory device;
responsive to an expiration of a first threshold amount of time after storing the set of user data:
performing, using the third portion of the error correction data, a first error correction operation, on the set of user data, the first portion, and the second portion; and
rewriting, on the memory device, the set of user data, the first portion, and the second portion; and
deleting the third portion.

2. The system of claim 1, wherein the processing device is to perform further operations comprising:
responsive to an expiration of a second threshold amount of time after storing the set of user data:
performing, using the second portion of the error correction data, a second error correction operation on each of the set of user data and the first portion;
rewriting, on the memory device, the set of user data and the first portion; and
deleting the second portion.

3. The system of claim 2, wherein performing error correction comprises:
retrieving the set of user data;
retrieving one or more portions of error correction data;
correcting one or more errors in the set of user data by using the one or more portions of error correction data; and
correcting one or more errors in the one or more portions of error correction data by using the set of user data, at least one portion of error correction data, or a combination of the set of user data and the at least one portion of error correction data.

4. The system of claim 2, wherein the first set of MUs comprises:

a first set of memory cells that store the set of user data, and
a second set of memory cells that store the first portion of error correction data, wherein both the first set of memory cells and the second set of memory cells are connected to a same wordline of the plurality of wordlines.

5. The system of claim 1, wherein the plurality of portions of error correction data comprises at least two different types of error correction data, each type of error correction data selected from parity data, target threshold voltage indication data, and duplicate data, and wherein each portion of error correction data comprises a single type of data.

6. The system of claim 1, wherein the plurality of portions of error correction data comprises a local portion and a remote portion, wherein the local portion is stored in the first set of MUs, the first set of MUs comprising the set of user data, and wherein the remote portion is stored in the second set of MUs or the third set of MUs.

7. The system of claim 1, wherein the first threshold amount of time depends on a total amount of error correction data in the plurality of portions of error correction data.

8. A method comprising:
storing a set of user data, on a memory device comprising an array of memory cells arranged into one or more management units (MUs), each memory cell respectively connected to a corresponding wordline of a plurality of wordlines;
storing, on the memory device, a plurality of portions of error correction data, wherein a first portion of the of the plurality of portions of error correction data is stored in a first set of MUs of the memory device, a second portion of the plurality of portions of error correction data is stored in a second set of MUs of the memory device, and a third portion of the plurality of portions of error correction data is stored in a third set of MUs of the memory device;
responsive to an expiration of a first threshold amount of time after storing the set of user data:
performing, using the third portion of the error correction data, a first error correction operation on the set of user data, the first portion of error correction data, and the second portion of error correction data; and
rewriting, on the memory device, the set of user data, the first portion of error correction data, and the second portion of error correction data; and
deleting the third portion of error correction data.

9. The method of claim 8, further comprising:
responsive to an expiration of a second threshold amount of time after storing the set of user data:
performing, using the second portion of the error correction data, a second error correction operation on each of the set of user data and the first portion of error correction data;
rewriting, on the memory device, the set of user data and the first portion of error correction data; and
deleting the second portion of error correction data.

10. The method of claim 9, wherein performing error correction comprises:
retrieving the set of user data;
retrieving one or more portions of error correction data;
correcting one or more errors in the set of user data by using the one or more portions of error correction data; and
correcting one or more errors in the one or more portions of error correction data by using the set of user data, at least one portion of error correction data, or a combination of the set of user data and the at least one portion of error correction data.

11. The method of claim 8, wherein the first set of management units comprises:

a first set of memory cells that store the set of user data, and a second set of memory cells that store the first portion of error correction data, wherein both the first set of memory cells and the second set of memory cells are connected to a same wordline of the plurality of wordlines.

12. The method of claim 8, wherein the plurality of portions of error correction data comprises at least two different types of error correction data, each type of error correction data selected from parity data, target threshold voltage indication data, and duplicate data, and wherein each portion of error correction data comprises a single type of data.

13. The method of claim 8, wherein the plurality of portions of error correction data comprises a local portion of error correction data and a remote portion of error correction data, wherein the local portion of error correction data is stored in the first set of MUs, the first set of MUs comprising the set of user data, and wherein the remote portion of error correction data is stored in the second set of MUs or the third set of MUs.

14. The method of claim 8, wherein the first threshold amount of time depends on a total amount of correction data in the plurality of portions of error correction data.

15. A non-transitory computer-readable storage medium comprising instructions that, when executed by a processing device, cause the processing device to perform operations comprising:

writing a set of user data in a first location on a memory device, the memory device comprising an array of memory cells arranged into one or more management units, each memory cell respectively connected to a corresponding wordline of a plurality of wordlines;

writing, in a first set of locations on the memory device, a set of portions of error correction data associated with the set of user data, each respective portion of error correction data being written in a corresponding location of the first set of locations;

responsive to an expiration of a first threshold amount of time relative to writing the set of user data:

regenerating, using a first portion of error correction data, the set of user data and one or more remaining portions of error correction data;

rewriting, in the first location, the set of user data; and rewriting each respective remaining portion of error correction data in the corresponding location of the first set of locations; and marking the first portion of error correction data as invalidated to allow erasure of the first portion of error correction data.

16. The non-transitory computer-readable storage medium of claim 15, wherein the instructions cause the processing device to perform the operations further comprising:

erasing the first portion of error correction data.

17. The non-transitory computer-readable storage medium of claim 16, wherein the instructions cause the processing device to perform the operations further comprising:

responsive to an expiration of a second threshold amount of time relative to writing the set of data:

regenerating, using a second portion of error correction data, the set of user data and the one or more remaining portions of error correction data;

rewriting, in the first location, the set of user data; and rewriting, in a second set of locations on the memory device, the one or more remaining portions of error correction data, each respective remaining portion of error correction data being rewritten in the corresponding location of the second set of locations; and marking the second portion of error correction data as invalidated to allow erasure of the second portion of error correction data.

18. The non-transitory computer-readable storage medium of claim 15, wherein regenerating the set of user data and one or more remaining portions of error correction data comprises:

retrieving the set of user data from the first location;

retrieving one or more portions of error correction data, wherein the one or more portions of error correction data comprise the first portion of error correction data;

correcting one or more errors in the set of user data by using the one or more portions of error correction data; and correcting one or more errors in the one or more portions of error correction data by using the set of user data, the first portion of error correction data, or a combination of the set of user data and the first portion of error correction data.

19. The non-transitory computer-readable storage medium of claim 15, wherein the set of portions of error correction data comprises at least two different types of error correction data, each type of error correction data selected from parity data, threshold voltage indication data, and duplicate data, and wherein each portion of error correction data comprises a single type of data.

20. The non-transitory computer-readable storage medium of claim 15, wherein the set of portions of error correction data comprises a local portion of error correction data and a remote portion of error correction data, wherein the local portion of error correction data is written to a first management unit, the first management unit comprising the set of user data, and wherein the remote portion of error correction data is written to a second management unit that is in a different location than the first management unit on the memory device.

* * * * *